United States Patent [19]
Gilbert

[11] Patent Number: 6,008,701
[45] Date of Patent: Dec. 28, 1999

[54] QUADRATURE OSCILLATOR USING INHERENT NONLINEARITIES OF IMPEDANCE CELLS TO LIMIT AMPLITUDE

[75] Inventor: Barrie Gilbert, Portland, Oreg.

[73] Assignee: Analog Devices, Inc., Norwood, Mass.

[21] Appl. No.: 09/033,510

[22] Filed: Mar. 2, 1998

[51] Int. Cl.$^6$ ............... H03B 5/02; H03B 5/06; H03L 5/00
[52] U.S. Cl. ............ 331/57; 330/252; 330/254; 331/109; 331/115; 331/135; 331/177 R
[58] Field of Search ............... 331/57, 109, 115, 331/135, 136, 177 R, 183; 330/252, 253, 254

[56] References Cited

U.S. PATENT DOCUMENTS

| | | | |
|---|---|---|---|
| 5,117,205 | 5/1992 | Nauta | 331/34 |
| 5,489,878 | 2/1996 | Gilbert | 331/57 |
| 5,635,879 | 6/1997 | Sutardja et al. | 331/57 |
| 5,714,911 | 2/1998 | Gilbert | 331/57 |

Primary Examiner—Siegfried H. Grimm
Attorney, Agent, or Firm—Marger Johnson & McCollom, P.C.

[57] ABSTRACT

A quadrature oscillator based on two cross-coupled gm/C cells utilizes the inherent nonlinearity of positive and negative impedance cells to control the amplitude of oscillation, thereby simplifying the oscillator and eliminating the need for an outer control loop. The oscillator includes a pair of cross-coupled gm/C stages. A negative impedance cell is coupled to each gm/C cell for assuring proper start-up and enhancing the amplitude of oscillation. A positive impedance cell is also coupled to each gm/C cell to dampen the amplitude of oscillation. The transconductance of each impedance cell varies in response to the bias current provided to the cell. Thus, by controlling the bias currents through the cells, the negative and positive impedances seen by each gm/C cell can made to cancel at the desired oscillation amplitude, so that the circuit oscillates without any damping or enhancement. By utilizing the inherent nonlinearity of positive and negative impedance cells, the bias currents provided to the impedance cells can remain fixed for a given frequency of operation, thereby simplifying the design of the oscillator and providing precise, robust control.

19 Claims, 2 Drawing Sheets

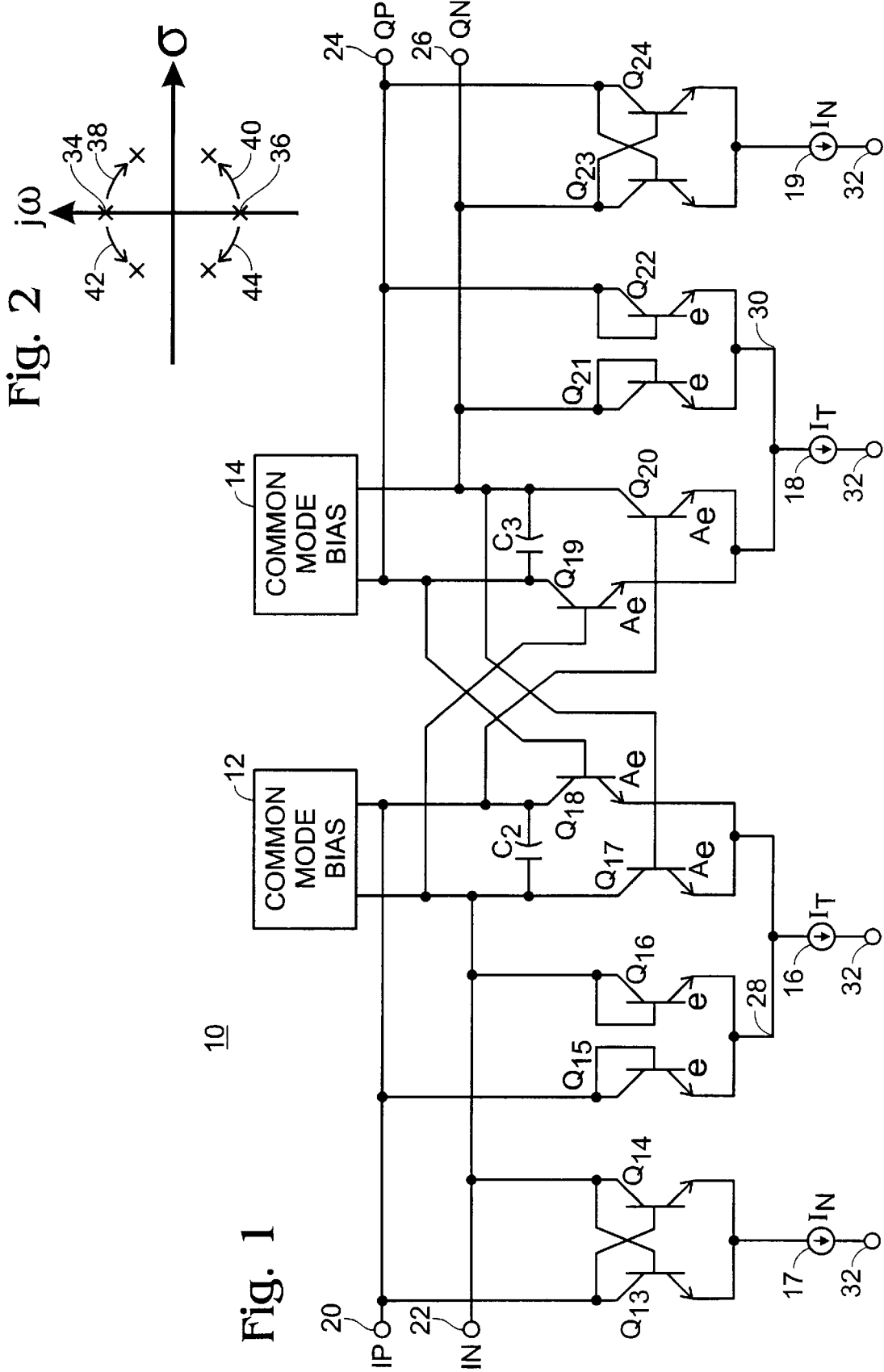

QUADRATURE OSCILLATOR USING INHERENT NONLINEARITIES OF IMPEDANCE CELLS TO LIMIT AMPLITUDE

BACKGROUND OF THE INVENTION

1. Field of the Invention

This invention relates generally to quadrature oscillators, and more particularly, to a technique for maintaining low phase noise while modulating the amplitude of a quadrature oscillator.

2. Description of the Related Art

Quadrature oscillators based on two cross-coupled gm/C integrator stages provide high-frequency operation with low phase noise and are suitable for bipolar monolithic implementation. An example of such a quadrature oscillator is disclosed in U.S. Pat. No. 5,489,878 which is herein incorporated by reference. To assure low phase noise, the amplitude of such a quadrature oscillator must be limited so as to prevent a nearly perfect sinusoidal oscillation from becoming a large amplitude relaxation oscillation with high phase noise.

Some techniques for controlling the amplitude of a quadrature oscillator are described in the above-referenced U.S. Patent, as well as U.S. Pat. No. 5,714,911 which is also herein incorporated by reference. These techniques generally involve clamping the oscillation signal to a reference voltage or utilizing an outer control loop which senses the oscillation amplitude and then drives a positive or negative impedance cell responsive to the sensed amplitude so as to maintain a stable amplitude of oscillation.

SUMMARY OF THE INVENTION

A quadrature oscillator in accordance with the present invention provides precise, automatic control of the oscillation amplitude in a compact circuit that requires no outer control loop. The present invention utilizes the translinear properties of transistors to implement the amplitude control function within the oscillator itself.

A quadrature oscillator in accordance with the present invention includes a pair of cross-coupled gm/C stages (cells) which oscillate in quadrature. (As used herein, the term "gm/C cell" is essentially synonymous with the concept of an integrator stage having the transfer function $V_{OUT}(s)=V_{IN}(s)/sC$.) A negative impedance cell is coupled to each gm/C cell for assuring proper start-up, promoting oscillation, and enhancing the amplitude. A positive impedance cell is also coupled to each gm/C cell to dampen oscillation and thereby limit the amplitude. The transconductance of each impedance cell varies in response to the individual bias currents provided to each cell. By controlling the bias currents through the cells, the negative and positive impedances seen by each gm/C cell can be made to cancel at the desired oscillation amplitude, so that the circuit oscillates without either damping or enhancement. However, instead of utilizing a complicated feedback loop to modulate the bias currents to the variable impedance cells so as to control the amplitude, the present invention utilizes the inherent nonlinearities of the impedance cells to limit the amplitude. This allows the bias currents provided to the impedance cells of the present invention to remain fixed for a given frequency of operation. The bias currents need only be changed for purposes of tuning the oscillator. This greatly simplifies the design of the oscillator and provides precise, robust control.

Therefore, it is an object of the present invention to provide an improved technique for controlling the amplitude of a quadrature oscillator.

Another object of the present invention is to simplify the design of a quadrature oscillator.

A further object of the present invention is reduce the phase noise of a quadrature oscillator.

To accomplish these and other objects, a quadrature oscillator constructed in accordance with the present invention utilizes positive impedance cells that each include two diode-connected transistors which share a bias current with the differential pair of transistors in its associated gm/C cell. By making the emitter areas of the diode-connected transistors much smaller than those of the gm/C cell, the positive impedance cells initially only divert a small portion of the bias currents from the gm/C cells. The positive impedance cells are designed so that their transconductance is slightly higher than that of the negative impedance cells at low oscillation amplitude. Thus, the negative impedance cells initially prevail and cause the oscillation amplitude to increase. However, as the amplitude increases, i.e., the voltage swing across the outputs of the gm/C cells increases, the nonlinearity of the diode-connected transistors causes the positive impedance cells to divert additional current from the gm/C cells until a stable condition is reached, wherein the net transconductance of the positive impedance (damping) cells is exactly equal to that of the negative impedance (enhancing) cells, and the impedances cancel so as to allow the circuit to oscillate at a fixed amplitude.

One aspect of the present invention is an oscillator comprising: a first gm/C stage having an input port and an output port; a second gm/C stage having an input port and an output port, wherein the input and output ports of the first and second gm/C stages are cross coupled, thereby causing the first and second gm/C stages to oscillate in quadrature; a first negative impedance cell coupled to the output port of the first gm/C stage; a second negative impedance cell coupled to the output port of the second gm/C stage; a first positive impedance cell coupled to the output port of the first gm/C stage; and a second positive impedance cell coupled to the output port of the second gm/C stage. A nonlinearity in one or more of the impedance cells causes the positive and negative impedances to cancel at a certain amplitude of oscillation, thereby controlling the amplitude of oscillation.

Another aspect of the present invention is an oscillator comprising: a first gm/C stage having an input port and an output port; a second gm/C stage having an input port and an output port, wherein the input and output ports of the first and second gm/C stages are cross coupled, thereby causing the first and second gm/C stages to oscillate in quadrature; a first negative impedance cell coupled to the output port of the first gm/C stage; a second negative impedance cell coupled to the output port of the second gm/C stage; a first positive impedance cell coupled to the output port of the first gm/C stage; a second positive impedance cell coupled to the output port of the second gm/C stage; and a bias circuit coupled to the first and second gm/C stages, the first and second negative impedance cells, and the first and second positive impedance cells for providing bias currents thereto; wherein the positive and negative impedances cancel at a certain amplitude of oscillation, thereby controlling the amplitude of oscillation.

A further aspect of the present invention is a quadrature oscillator comprising: a first gm/C stage; a second gm/C stage cross-coupled to the first gm/C stage so as to oscillate in quadrature; a first negative impedance cell coupled to the first gm/C stage for driving the first gm/C stage; a second negative impedance cell coupled to the second gm/C stage for driving the second gm/C stage; a first positive impedance cell coupled to the first gm/C stage for damping the first gm/C stage; and a second positive impedance cell coupled to the second gm/C stage for damping the second gm/C stage; wherein the transconductance of the negative impedance cells is greater than the transconductance of the positive impedance cells at low oscillation amplitudes, and the transconductance of the positive impedance cells is greater than the transconductance of the negative impedance cells at high oscillation amplitudes.

An advantage of the present invention is that it does not require a separate start-up circuit other than the negative impedance cell.

Another advantage of the present invention is that it reduces the number of components required to control the amplitude of oscillation of a quadrature oscillator.

A further advantage of the present invention is that it provides very rapid amplitude control that operates on a cycle-by-cycle basis.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 1 is a schematic diagram of a first embodiment of a quadrature oscillator constructed in accordance with the present invention.

FIG. 2 is an s-plane diagram for explaining the operation of the circuit of FIG. 1.

DETAILED DESCRIPTION

Figure 3:
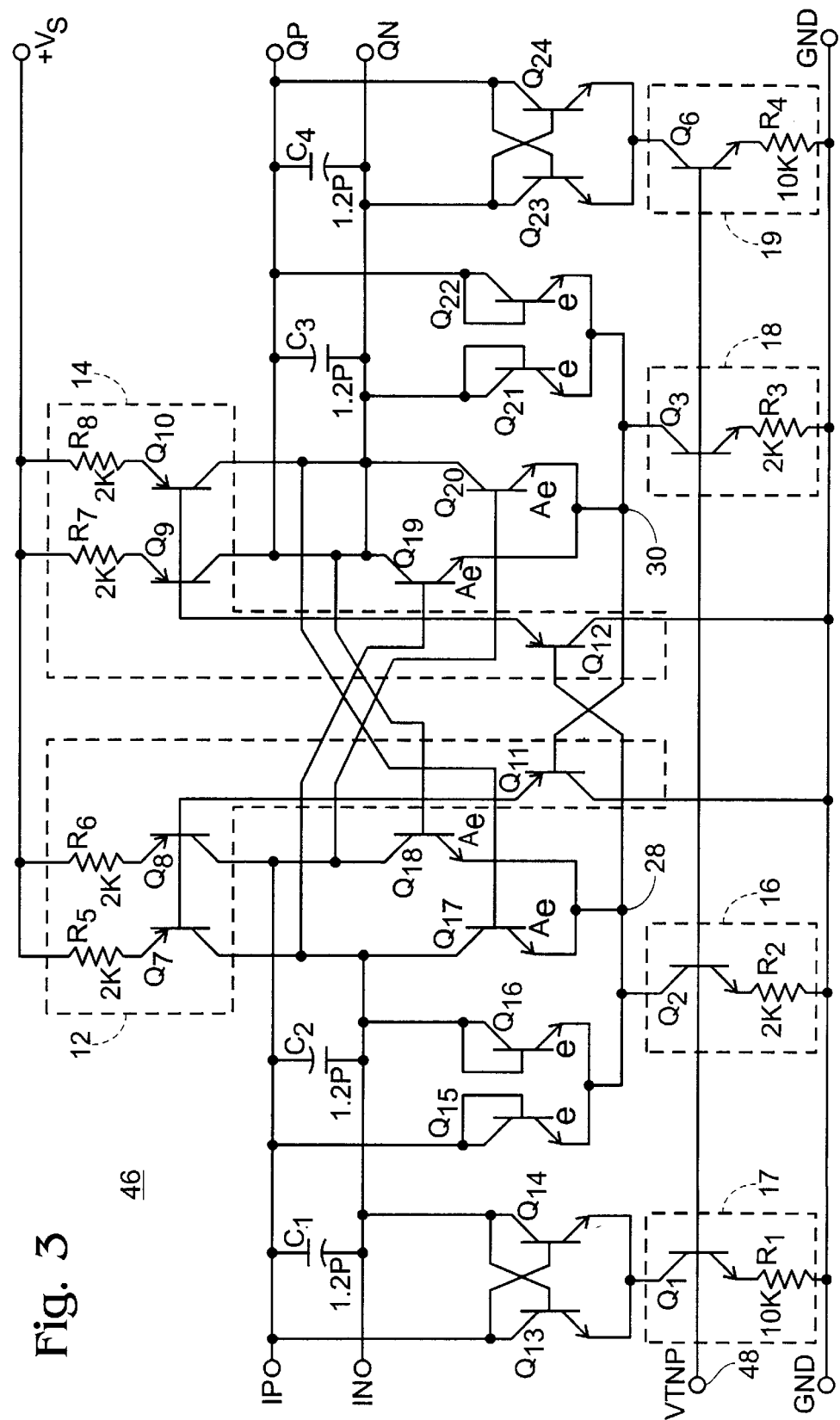
FIG. 3 is a schematic diagram of a second embodiment of a quadrature oscillator constructed in accordance with the present invention.

FIG. 1 is a schematic diagram of an embodiment of a quadrature oscillator constructed in accordance with the present invention. The oscillator, indicated generally at 10, includes a first gm/C cell formed from a differential pair of NPN transistors Q17–Q18 and a capacitor C2, and a second gm/C cell formed from a differential pair of NPN transistors Q19–Q20 and a capacitor C3. The oscillator 10 also includes two negative impedance cells formed from cross-coupled NPN transistor pairs Q13–Q14 and Q23–Q24, as well as two positive impedance cells formed from diode coupled NPN transistor pairs Q15–Q16 and Q21–Q22. Common mode bias circuits 12 and 14 are coupled to the gm/C cells for controlling the common mode bias thereof. Bias current sources 16 and 18 are coupled to provide tunable bias currents (or "tail" currents) IT to the gm/C cells, as well as the positive impedance cells. Bias current sources 17 and 19 are coupled to provide tunable bias currents $I_N$ to the negative impedance cells. The gm/C cells, as well as the common mode bias circuits 12 and 14, are connected as described in U.S. Pat. No. 5,489,878 and will not be described further except to indicate that the output terminals of the first gm/C cell form output terminals 20 and 22 for outputting the positive and negative "in-phase" signals IP and IN, respectively, and the output terminals of the second gm/C cell form output terminals 24 and 26 for outputting the positive and negative "quadrature" signals QP and QN, respectively.

The anode of diode-connected transistor Q15 is connected to terminal 20, while the anode of diode-connected transistor Q16 is connected to terminal 22. The cathodes of Q15 and Q16 are connected to a node 28. Likewise, the anodes of diode-connected transistor Q21 and Q22 are connected to terminals 26 and 24, respectively, while the cathodes of Q21 and Q22 are connected to a node 30.

The collectors of transistors Q13 and Q14 are connected to terminals 20 and 22, respectively, while both of their emitters are commonly connected to current source 17. The bases of Q13 and Q14 are cross-connected to the collectors of Q14 and Q13, respectively. Likewise, the collectors of transistors Q23 and Q24 are connected to terminals 26 and 24, respectively, while both of their emitters are commonly connected to current source 19. The bases of Q23 and Q24 are cross-connected to the collectors of Q24 and Q23, respectively.

Bias current source 16 is connected to node 28 to provide a tail current $I_T$ thereto, while current source 18 is connected to node 30 to provide a tail current $I_T$ thereto. Bias current source 17 provides a tail current $I_N$ to the negative impedance cell formed from transistors Q13 and Q14, and bias current source 19 provides a tail current $I_N$ to the negative impedance cell formed from transistors Q23 and Q24. Although none of the current sources 16, 17, 18 and 19 (which can be varied to change the operating frequency of the oscillator) are shown connected to a supply voltage, it is assumed that these current sources are connected to some source of supply voltage at terminal 32 as is known in the art. Likewise, common mode bias circuits 12 and 14 are assumed to be powered by a suitable power supply voltage.

Transistor pairs Q15–Q16 and Q21–Q22, which form the positive impedance cells, are shown with emitter areas of "e", where "e" is a unit emitter area. The transistor pairs Q17–Q18 and Q19–Q20, which form the gm/C cells, are shown with emitter areas of "Ae", which indicates that they are A times larger than those of Q15–Q16 and Q21–Q22.

The operation of the quadrature oscillator 10 will now be described with reference to FIG. 1. The first gm/C integrator cell, which includes Q17 and Q18, works into capacitor C2. The second gm/C cell, which includes Q19 and Q20, works into capacitor C3. The two integrators are cross connected so as to form an oscillatory loop ideally having a loop transfer function in which a pair of conjugate poles of the transfer equation lie exactly on the imaginary axis of the s-plane as shown at 34 and 36 in FIG. 2. This means that, in the absence of the positive and negative impedance cells, the circuit would not oscillate even though it is a highly resonant circuit with an infinite quality factor "Q" because there is only internal noise to cause it to start oscillating, and even a small amplitude of oscillation would imediately move the poles into the left-hand plane.

In a practical application, the oscillator must start and increase to a significant amplitude very rapidly as soon as it is powered up, and therefore, the natural oscillation tendencies of the oscillator are inadequate to provide adequate performance.

To provide adequate start-up performance, the currents in the negative impedance circuits formed by Q13–Q14 and Q23–Q24 start out relatively high in magnitude. This causes the poles 34 and 36 to move into the right-half plane as shown by arrows 38 and 40 in FIG. 2. As a result, the output oscillation signal grows inside an increasing exponential function that envelopes the oscillation signal. However, if the exponential behavior is allowed to continue indefinitely, the circuit undergoes a transition from a nearly perfect sinusoidal oscillation, to a relaxation oscillation. Since the gm/C cells Q17–Q18 and Q19–Q20 are simple differential pairs, the output currents become almost perfect square waves when the amplitude of the drive rises to about 100 millivolts. Then, the voltages across the integrating capacitors become triwaves. Each triwave is fed back to the other pair and is of sufficient amplitude that each pair acts like a "slicer" through the triwave generating another pair of square waves. The end result is a very large amplitude relaxation oscillation.

In some applications, distortion is not a key issue, so a square wave output would not be harmful in itself. However, the transition to a relaxation oscillation destroys the timing relationship of the oscillator which causes harmful phase noise. Under linear conditions, the frequency of oscillation is a closely determined function of the gm of the cells and the capacitors. When the bias currents and the values of the capacitors are fixed, the oscillation frequency $\omega_0$ is equal to gm/C. However, once the amplitude of the oscillation exceeds a certain critical level, the timing relationships become progressively worse.

Therefore, it is very important is provide accurate control of the amplitude. The circuit of FIG. 1 provides this control by utilizing the positive impedance cells comprising Q15–Q16 and Q21–Q22. The ratio A of the emitter areas of the transistors in the gm/C cells to those in the positive impedance cells is set to a relatively large value, for example 20 to 1. That is, the emitter areas of Q17, Q18, Q19 and Q20 are twenty times larger than the emitter areas of Q15, Q16, Q21 and Q22.

To understand the effect the emitter area ratio has on the operation of the circuit, it is useful to temporarily ignore the presence of the negative impedance cells. Without the negative impedance cells, the positive impedance cells (also referred to as "damping cells") comprising diodes Q15–Q16 and Q21–Q22 have two effects. First, they lower the current that is actually used in the gm/C cells because some of the total current available from the current sources 16 and 18 goes into the diodes. This changes the scaling relationship between the bias currents and the frequency of oscillation because the diodes divert about 5% of the bias current (because the area ratio is 20) when the amplitude of oscillation is zero. Second, and more significantly, the diodes place a resistance across the capacitors, and in the absence of the negative impedance cells, this would cause the poles to move into the left-hand side of the S plane as shown by arrows 42 and 44 in FIG. 2. This corresponds to a damping, or degenerative, situation, so any initial oscillation that might arise in the first place is damped by the presence of these diodes.

By choosing to make the transconductance of the outer negative impedance cells a little higher than the transconductance of the inner damping cells, the net effect at the outset is that the negative impedance prevails. This can be thought of as moving the poles slightly into the right-hand plane. Although the positive impedance cells are still present and they still put a resistance across the differential signal ports QP–QN and IP–IN, the negative resistance generated by the outer cells dominates the positive or normal resistance generated by the damping cells. Thus, the net effect is to move the poles into the right plane and oscillation begins.

As discussed above, the damping cells initially divert about 5% of the bias current from the gm/C cells. That is, $I_C/I_D \approx A$ before oscillation begins, where $I_C$ is the total current through the emitters of Q19 and Q20, $I_D$ is the total current through the emitters of Q21 and Q22, and therefore, $I_C+I_D=I_T$. However, this is based on the supposition that there is no significant voltage swing at the collector nodes of Q17, Q18 and Q19, Q20. Once there is some voltage swing, the current diverted from the gm/C cells by the damping cells increases rapidly due to the exponential nature of the diodes. The amplitude of the oscillation will increase until the net transconductance of the damping cells is exactly equal to the net transconductance (of the opposite sign) of the negative impedance cells. In the final stable situation, the net effect is that the poles are placed right back perfectly on the imaginary axis, and there is no net damping nor enhancing of the oscillation amplitude. This is a very direct embodiment of the translinear properties of the transistors in the cells.

FIG. 3 is a schematic diagram of a second embodiment of a quadrature oscillator 46 constructed in accordance with the present invention. Preferred component values for a practical implementation are also shown. The oscillator 46 includes many of the same components of the circuit of FIG. 1, and the same reference designators are used to refer to the components corresponding to those shown in FIG. 1.

Referring to FIG. 3, the common mode bias circuits 12 and 14 are implemented with transistors Q7–Q12 and resistors R5–R8 which are connected as described in U.S. Pat. No. 5,489,878, so they will not be described further.

Current source 16 is implemented as an NPN transistor Q2 having a collector connected to node 28, an emitter coupled to GND through a resistor R2, and a base connected to a terminal 48 for receiving a variable bias voltage VTNP for tuning the oscillator. Current source 18 is implemented as an NPN transistor Q3 having a collector connected to node 30, an emitter coupled to GND through a resistor R3, and a base connected to terminal 48 for receiving the bias voltage VTNP.

The negative impedance cell formed by Q13–Q14 is biased by current source 17 which is implemented as an NPN transistor Q1 which has a collector commonly connected to the emitters of Q13 and Q14, an emitter coupled to GND through a resistor R1, and a base connected to terminal 48 for receiving the bias voltage VTNP. The negative impedance cell formed by Q23–Q24 is biased by current source 19 which is implemented as an NPN transistor Q6 which has a collector commonly connected to the emitters of Q23 and Q24, an emitter coupled to GND through a resistor R4, and a base connected to terminal 48 for receiving the bias voltage VTNP.

The operation of the oscillator circuit of FIG. 3 is in most respects similar to that of FIG. 2. When the circuit of FIG. 3 is settled, the tail currents through Q15–Q16 and Q21–Q22 will end up being the same as the average current in the tails of Q13–Q14 and Q23–Q24, respectively, so the net positive or real resistance (which is nonlinear) of the damping cells is exactly canceled by the enhancement effected by Q13–Q14 and Q23–Q24. Thus, by changing the tail currents in the positive and negative impedance cells, the average currents in the positive and negative impedance cells can be made exactly equal at the desired amplitude of oscillation.

All four of the bias current (tail current) sources for the cells are controlled in strict proportion to the signal VTNP which tunes the oscillator by varying the tail currents.

It should also be noted that the combination of the positive impedance cell and the gm cell has separate utility apart from its use in a quadrature oscillator. For example, the positive impedance cell Q21–Q22, the gm cell Q19–Q20, and the current source 18 of FIG. 1 form a damped transconductance cell which is useful apart from the other circuitry of FIG. 1 and which utilizes the non-linear characteristics of the diode connected transistors to provide gentle damping at low collector voltage levels on Q19 and Q20, and progressively more vigorous damping as the voltage levels increase.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. An oscillator comprising:
a first gm/C stage having an input port and an output port;
a second gm/C stage having an input port and an output port, wherein the input and output ports of the first and second gm/C stages are cross coupled, thereby causing the first and second gm/C stages to oscillate in quadrature;
a first negative impedance cell coupled to the output port of the first gm/C stage so as to divert current away from the first gm/C stage;
a second negative impedance cell coupled to the output port of the second gm/C stage so as to divert current away from the second gm/C stage;
a first positive impedance cell coupled to the output port of the first gm/C stage so as to divert current away from the first gm/C stage; and
a second positive impedance cell coupled to the output port of the second gm/C stage so as to divert current away from the second gm/C stage.

2. An oscillator according to claim 1 wherein a nonlinearity in one or more of the impedance cells causes the positive and negative impedances to cancel at a certain amplitude of oscillation, thereby controlling the amplitude of oscillation.

3. An oscillator according to claim 1 wherein:
the first positive impedance cell includes a first pair of diode-connected transistors coupled between the output port of the first gm/C cell and a first node for receiving a first bias current; and
the second positive impedance cell includes a second pair of diode-connected transistors coupled between the output port of the second gm/C cell and a second node for receiving a second bias current.

4. An oscillator according to claim 3 wherein:
the first negative impedance cell includes a first pair of cross-coupled transistors coupled between the output port of the first gm/C cell and a third node for receiving a third bias current; and
the second negative impedance cell includes a second pair of cross-coupled transistors coupled between the output port of the second gm/C cell and a fourth node for receiving a fourth bias current.

5. An oscillator according to claim 1 further including:
a first common mode bias circuit coupled to the output port of the first gm/C stage; and
a second common mode bias circuit coupled to the output port of the second gm/C stage.

6. An oscillator comprising:
a first gm/C stage having an input port and an output port;
a second gm/C stage having an input port and an output port, wherein the input and output ports of the first and second gm/C stages are cross coupled, thereby causing the first and second gm/C stages to oscillate in quadrature;
a first negative impedance cell coupled to the output port of the first gm/C stage;
a second negative impedance cell coupled to the output port of the second gm/C stage;
a first positive impedance cell coupled to the output port of the first gm/C stage so as to divert current away from the first gm/C stage;
a second positive impedance cell coupled to the second gm/C stage so as to divert current away from the second gm/C stage; and
a bias circuit coupled to the first and second gm/C stages, the first and second negative impedance cells, and the first and second positive impedance cells for providing bias currents thereto;
wherein the bias currents remain fixed for a given frequency of oscillation.

7. An oscillator according to claim 6 wherein:
the first and second positive impedance cells are coupled to first and second nodes for receiving first and second bias currents, respectively;
the first and second negative impedance cells are coupled to third and fourth nodes for receiving third and fourth bias currents, respectively.

8. An oscillator according to claim 7 wherein the first and second gm/C cells are coupled to the first and second nodes, respectively.

9. An oscillator according to claim 8 further including first, second, third and fourth current sources coupled to the first, second, third and fourth nodes, respectively.

10. An oscillator according to claim 9 wherein each current source includes a transistor having a first terminal coupled to a corresponding one of the nodes, a second terminal coupled to a power supply terminal, and a third terminal coupled to a common terminal fore receiving a bias signal.

11. A quadrature oscillator comprising:
a first gm/C stage;
a second gm/C stage cross-coupled to the first gm/C stage so as to oscillate in quadrature;
a first negative impedance cell coupled to the first gm/C stage;
a second negative impedance cell coupled to the second gm/C stage;
a first positive impedance cell coupled in parallel with the first gm/C stage; and
a second positive impedance cell coupled in parallel with the second gm/C stage.

12. An oscillator according to claim 11 wherein the transconductance of the negative impedance cells is greater than the transconductance of the positive impedance cells at low oscillation amplitudes, and the transconductance of the positive impedance cells is greater than the transconductance of the negative impedance cells at high oscillation amplitudes.

13. An oscillator according to claim 11 further including:
a first common mode bias circuit coupled to the first gm/C stage; and
a second common mode bias circuit coupled to the second gm/C stage.

14. An oscillator according to claim 11 wherein:
each of the gm/C stages has first and second output terminals;
the first positive impedance cell includes:
a first diode-connected transistor coupled between the first output terminal of the first gm/C stage and a first node for receiving a first bias current, and
a second diode-connected transistor coupled between the second output terminal of the first gm/C stage and the first node; and the second positive impedance cell includes:
- a third diode-connected transistor coupled between the first output terminal of the second gm/C stage and a second node for receiving a second bias current, and
- a fourth diode-connected transistor coupled between the second output terminal of the second gm/C stage and the second node.

15. An oscillator according to claim 14 wherein:
- the first gm/C stage includes a first differential pair of transistors coupled to the first node to receive a portion of the first bias current; and
- the second gm/C stage includes a second differential pair of transistors coupled to the second node to receive a portion of the second bias current.

16. An oscillator according to claim 9 wherein the first and second diode-connected transistors are bipolar junction transistors having emitter areas of "e", the first differential pair of transistors are bipolar junction transistors having emitter areas of "Ae", and the emitter area ratio "A" is relatively large.

17. A damped transconductance cell comprising:
- a differential pair of transistors having an input port, and output port, and a common terminal for receiving a portion of a bias current, wherein the common terminal is coupled to a node;
- a pair of diode-connected transistors coupled in parallel with the differential pair; and
- a current source coupled to the node for providing the bias current thereto.

18. A damped transconductance cell according to claim 17 wherein:
- the output port includes first and second output terminals;
- the input port includes first and second input terminals;
- the differential pair includes:
  - a first differential transistor having a first terminal coupled to the first output terminal, a second terminal coupled to the first input terminal, and a third terminal coupled to the common terminal, and
  - a second differential transistor having a first terminal coupled to the second output terminal, a second terminal coupled to the second input terminal, and a third terminal coupled to the common terminal;
- the pair of diode-connected transistors includes:
  - a first diode-connected transistor coupled between the first output terminal and the node, and
  - a second diode-connected transistor coupled between the second output terminal and the node.

19. A damped transconductance cell according to claim 18 wherein the first and second diode-connected transistors are bipolar junction transistors having emitter areas of "e", the first and second differential transistors are bipolar junction transistors having emitter areas of "Ae", and the emitter area ratio "A" is relatively large.

* * * * *

UNITED STATES PATENT AND TRADEMARK OFFICE
CERTIFICATE OF CORRECTION

PATENT NO.     : 6,008,701
DATED          : December 28, 1999
INVENTOR(S)    : Gilbert Page 1 of 1

It is certified that error appears in the above-identified patent and that said Letters Patent is hereby corrected as shown below:

Column 2,
Line 13, "positive" should read -- negative --.
Line 16, "negative" should read -- positive --.

Column 3,
Line 52, "IT" should read -- IT --.

Column 4,
Line 49, "imediately" should read -- immediately --.

Column 8,
Line 31, "fore" should read -- for --.

Signed and Sealed this

Fourth Day of February, 2003

JAMES E. ROGAN
*Director of the United States Patent and Trademark Office*